(12) United States Patent
Chen

(10) Patent No.: US 6,281,527 B1
(45) Date of Patent: Aug. 28, 2001

(54) ELECTROSTATIC DISCHARGE PROTECTION CIRCUIT WITH HIGH TRIGGER CURRENT

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/241,547

(22) Filed: Feb. 1, 1999

(30) Foreign Application Priority Data

Feb. 12, 1998 (TW) ................................................ 87120009

(51) Int. Cl.[7] ................................................ H01L 21/332
(52) U.S. Cl. ........................ 257/168; 257/355; 257/356; 257/360
(58) Field of Search .................................. 257/168, 107, 257/112, 125, 355, 356, 360, 499

(56) References Cited

U.S. PATENT DOCUMENTS

| 5,012,317 | * 4/1991 | Rountre . |
| 5,336,908 | 8/1994 | Roberts . |
| 5,343,053 | 8/1994 | Avery . |
| 5,465,189 | 11/1995 | Polgreen et al. . |

* cited by examiner

Primary Examiner—Kevin M. Picardat
Assistant Examiner—D. M. Chen
(74) Attorney, Agent, or Firm—Ladas & Parry

(57) ABSTRACT

An ESD protection circuit for protecting a circuit, comprising a lateral semiconductor-controlled rectifier, a MOS transistor, and a current-sinking device. The lateral semiconductor-controlled rectifier is coupled to the circuit and provided with a first common region and a second common region. The MOS transistor integrated with the lateral semiconductor-controlled rectifier includes the first common region The current-sinking device integrated with the lateral semiconductor controlled rectifier includes the second common region. The current-sinking device shunts the majority of a discharge current when the MOS transistor enters breakdown, thereby increasing the trigger current of the lateral semiconductor-controlled rectifier.

18 Claims, 3 Drawing Sheets

US 6,281,527 B1

ELECTROSTATIC DISCHARGE PROTECTION CIRCUIT WITH HIGH TRIGGER CURRENT

BACKGROUND OF THE INVENTION

1. Field of the Invention

The present invention relates to electrostatic discharge protection for semiconductor integrated circuitry. More particularly, the present invention relates to an electrostatic discharge protection circuit with a high trigger current.

2. Description of the Related Art

In sub-micron CMOS technologies, electrostatic discharge (ESD) protection has become a main concern in relation to the reliability of semiconductor integrated circuitry. Usually, MOS transistors near IC pads are designed with enlarged dimensions to provide on-chip ESD robustness. However, CMOS integrated circuits have become more vulnerable to ESD damage due to advanced processes such as the use of light-doped drains (LDDs) and clad silicide diffusions. Moreover, the fact that MOS transistors with enlarged dimensions occupy more layout area is contrary to the trend of scale miniaturization.

U.S. Pat. Nos. 5,012,317 and 5,336,908 disclose a lateral semiconductor-controlled rectifier (LSCR) as an on-chip ESD protection circuit. The required voltage for triggering conventional LSCR's relies heavily upon the junction breakdown between a substrate and the well region formed therein, being therefore in the range of about 30~50V. Thus, the conventional LSCR's may not offer effective ESD protection for sub-micron CMOS devices because the gate oxides of the MOS transistors are permanently damaged before triggering.

To reduce the trigger voltage of the LSCR's without increasing the leakage current, a modified LSCR incorporating a field oxide device has been proposed by A. Amerasekera and C. Duvvury, as disclosed in "ESD in Silicon Integrated Circuits," John Wieley & Sons Press, 1998, p.90; furthermore, an LSCR triggered by a zener diode has been disclosed in U.S. Pat. No. 5,343,053. The trigger voltage can be further reduced to 10~15V by replacing the aforementioned field oxide device with a thin oxide MOS transistor as disclosed in U.S. Pat. No. 5,465,189. The cross-sectional view of the low voltage triggering SCR (LVTSCR) is depicted in FIG. 1.

In FIG. 1, the LVTSCR is fabricated onto a P-type semiconductor substrate 10 in which an N-well 11 is provided. A P-type doped region 12 and an N-type doped region 13 are spaced apart and formed in the N-well 11 while tied together to an IC pad 1 coupled to an internal circuit 2. The internal circuit 2 denotes the core circuit of an integrated circuit to be protected by the LVTSCR. Another N-type doped region 14 and P-type doped region 15 are spaced apart and formed in the P-type semiconductor substrate 10 while tied together to a power node $V_{SS}$ that is powered by a ground potential under normal operation.

In addition, an N-type doped region 16 is provided with one portion formed in the N-well 11 and another portion formed in the P-type semiconductor substrate 10 to span the P/N junction therebetween. A gate structure 17 is disposed on the P-type semiconductor substrate 10 between the N-type doped regions 14 and 16. From bottom to top, the gate structure 17 comprises an oxide layer 18 formed on the P-type semiconductor substrate 10 and an electrode layer 19 connected to the power node $V_{SS}$.

Accordingly, the P-type doped region 12, N-well 11 and P-type semiconductor substrate 10 constitute the emitter, base, and collector of a parasitic PNP bipolar junction transistor 20, respectively. Moreover, the P-type semiconductor substrate 10, N-well 11, and N-type doped region 14 constitute the collector, base, and emitter of a parasitic NPN bipolar junction transistor 21, respectively. The equivalent circuit of FIG. 1 is illustrated in FIG. 2, wherein resistors 22 and 23 designate the associated parasitic resistance spread over the N-well 11 and the P-type semiconductor substrate 10. In addition, reference numeral 24 designates the MOS transistor constituted by the N-type doped regions 14 and 16, and the gate structure 17.

In the conventional LVTSCR, the trigger voltage is reduced, and so is the trigger current. If the LVTSCR suffers from external overshooting or undershooting noises under normal operation, it may be triggered to turn on improperly.

SUMMARY OF THE INVENTION

It is therefore an object of the present invention to provide an electrostatic discharge protection circuit with high trigger current for preventing the LSCR from improper conduction when suffering from the external overshooting or undershooting noises under normal operation.

The present invention achieves the above-indicated object by providing an ESD protection circuit for protecting a circuit, comprising a lateral semiconductor-controlled rectifier, a MOS transistor, and a current-sinking device. The lateral semiconductor-controlled rectifier is coupled to the circuit and provided with a first common region and a second common region. The MOS transistor integrated with the lateral semiconductor-controlled rectifier includes the first common region. The current-sinking device integrated with the lateral semiconductor controlled rectifier includes the second common region.

Therefore, the current-sinking device shunts the majority of a discharge current when the MOS transistor enters breakdown, thereby increasing the trigger current of the lateral semiconductor-controlled rectifier. When external overshooting or undershooting noises occur under the normal operation, the potential at the pad can be clamped to the snapback voltage of the PNP transistor because of the high trigger current provided by the ESD protection circuit in accordance with the present invention, thus not entering PNPN conduction. Therefore, the internal circuit is immune to function disorder or device damage.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 3:
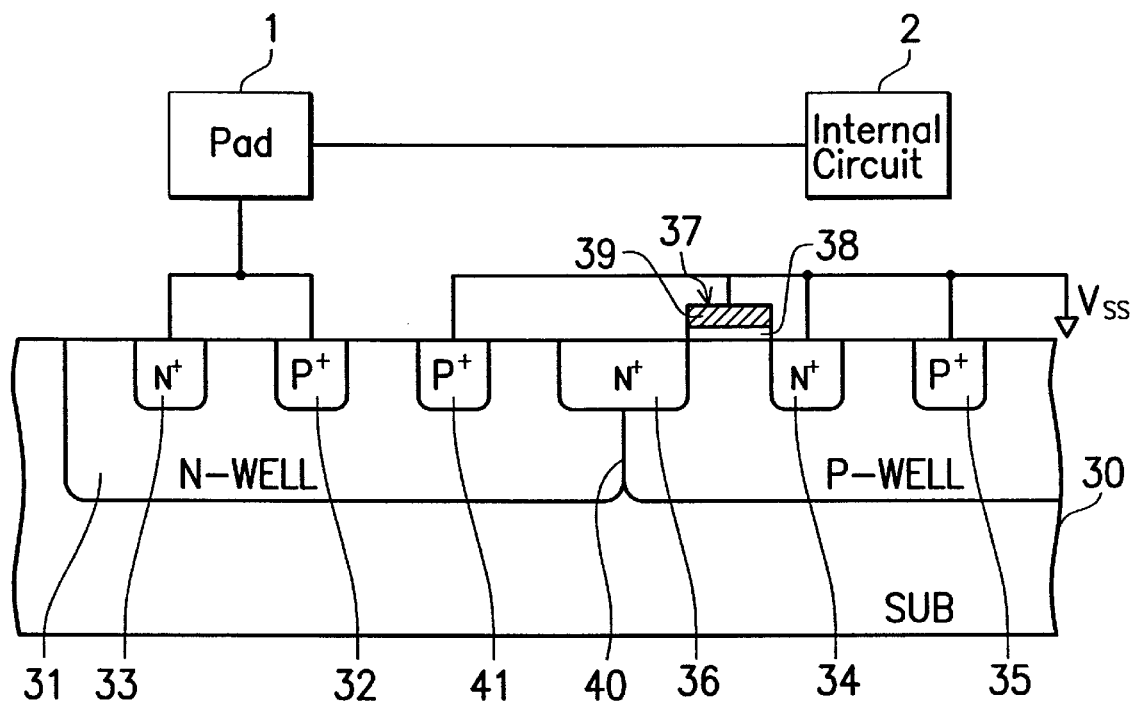
FIG. 3 schematically depicts one preferred embodiment of the present invention in a cross-sectional view.

Referring to FIG. 3, the cross-sectional view of one preferred embodiment of the present invention fabricated onto a semiconductor substrate is schematically illustrated. In the semiconductor substrate a P-type semiconductor layer 30 and an N-type semiconductor layer 31 are provided adjacent to each other to form a P/N junction 40 therebetween. For example, the P-type semiconductor layer 30 and the N-type semiconductor layer 31 can be dual wells formed in the semiconductor substrate, a P-type substrate and an N-well formed therein, or a P-well and an N-type semiconductor substrate. While the dual wells are exemplified in the drawings, the scope of the invention is not limited to the following embodiments.

As shown in FIG. 3, a P-type doped region 32 and an N-type doped region 33 are spaced apart and formed in the N-type semiconductor layer 31, wherein the P-type doped region 32 is closer to the junction 40 than the N-type doped region 33.

Another N-type doped region 34 and P-type doped region 35 are spaced apart and formed in the P-type semiconductor layer 30, wherein the N-type doped region 34 is closer to the junction 40 than the P-type doped region 35. The P-type doped region 32 and the N-type doped region 33 are connected together to the IC pad 1, which is coupled to the internal circuit 2 to be protected by the ESD protection circuit of the present invention. The N-type doped region 34 and the P-type doped region 35 are connected together to the power node $V_{SS}$ that is powered by ground potential under normal operation.

In addition, an N-type doped region 36 is provided with one portion formed in the N-type semiconductor layer 31 and another portion formed in the P-type semiconductor layer 30 so as to span the junction 40 therebetween. A gate structure 37 overlies a portion of the P-type semiconductor layer 30 between the N-type doped regions 34 and 36, comprising, from bottom to top, an oxide layer 38 and an electrode layer 39. The oxide layer 38 is formed on the P-type semiconductor layer 30 where the electrode layer 39 is connected to the power node $V_{SS}$.

Moreover, a P-type doped region 41 is provided in the N-type semiconductor layer 31 and formed between the P-type doped region 32 and the N-type doped region 36. The P-type doped region 41 is connected to the power node $V_{SS}$.

Figure 1:
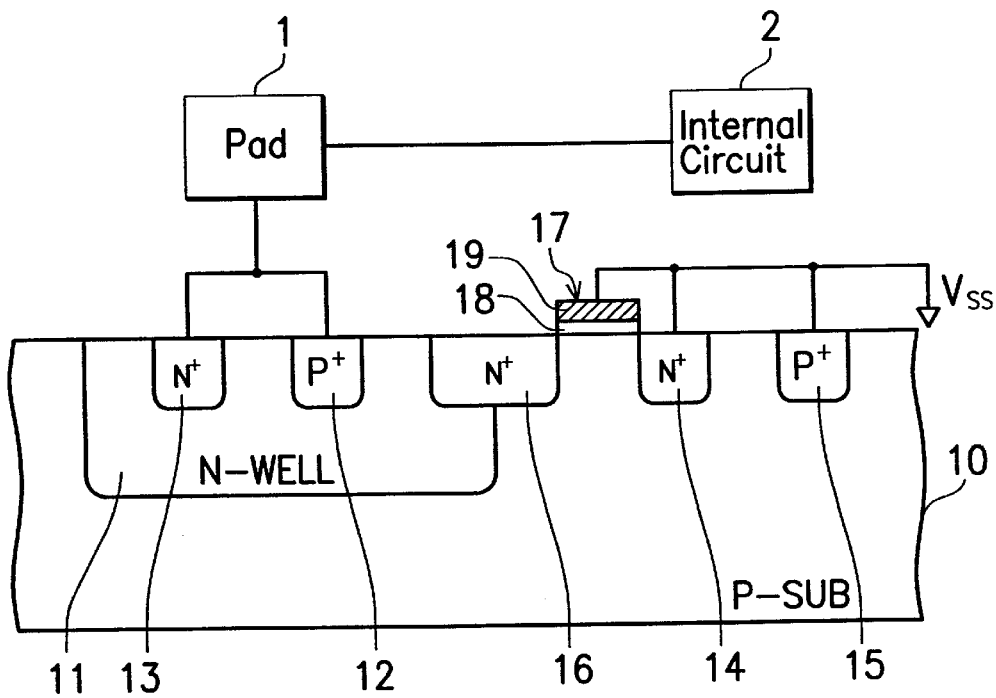
FIG. 1 schematically depicts a conventional LVTSCR in a cross-sectional view.
Figure 2:
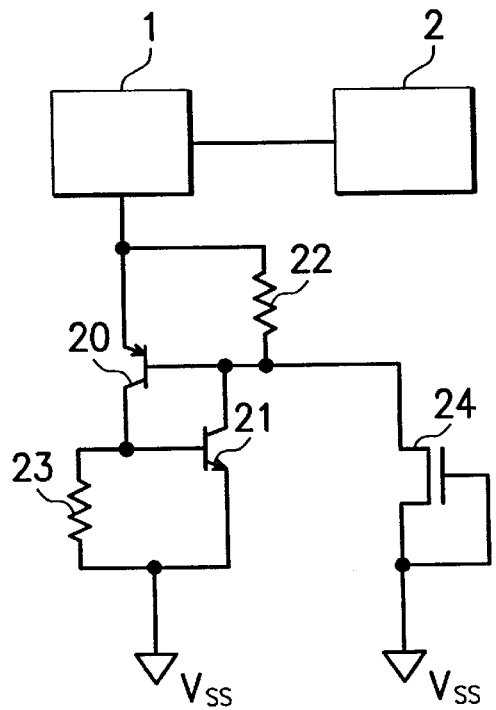
FIG. 2 schematically depicts the equivalent circuit off FIG. 1.

Accordingly, the P-type doped region 32, N-type semiconductor layer 31 and P-type doped region 41 constitute the emitter, base, and collector of a first PNP bipolar junction transistor 42A, respectively, while the P-type semiconductor layer 32, N-type semiconductor layer 31 and P-type semiconductor layer 30 constitute the emitter, base, and collector of a second PNP bipolar junction transistor 42B, respectively. In other words, the first PNP transistor 42A and the second PNP transistor 42B share the same emitter and base. Moreover, the P-type semiconductor layer 30, N-type semiconductor layer 31, and N-type doped region 34 constitute the collector, base, and emitter of an NPN bipolar junction transistor 43, respectively. The equivalent circuit of FIG. 1 is illustrated in FIG. 4.

Figure 4:
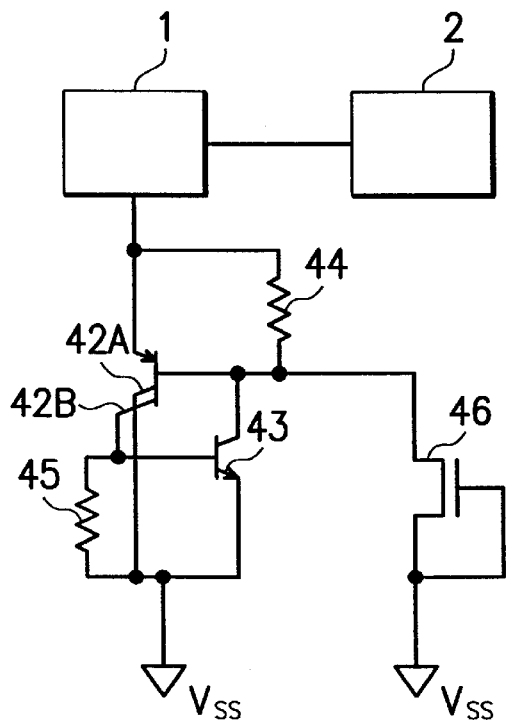
FIG. 4 schematically depicts the equivalent circuit of FIG. 3.

In FIG. 4, resistors 44 and 45 designates the associated parasitic resistance spread over the N-type semiconductor layer 31 and the P-type semiconductor layer 30. Moreover, reference numeral 46 designates the MOS transistor constituted by the N-type doped regions 34 and 36, and the gate structure 37. As shown in FIG. 4, the PNP transistors 42A and 42B have a common emitter and base, where the first PNP transistor 42A has its collector (the P-type doped region 41) connected to the power node $V_{SS}$, and the second PNP transistor 42B is configured with its collector (the P-type semiconductor layer 30) coupled to the power node $V_{SS}$ through the resistor 45.

The operation of the ESD protection circuit in accordance with the present invention will be described in conjunction with FIGS. 3 and 4.

When the ESD stress occurring to the pad 1 is high enough to cause the drain junction of the MOS transistor 46 (i.e., the junction between the N-type doped region 36 and the P-type semiconductor layer 30) to enter avalanche breakdown, the first and second PNP transistors 42A and 42B are turned on to clamp the potential at the pad 1 to the snapback voltage $V_{sb}$ of the PNP transistor. Therefore, the trigger voltage $V_t$ of the ESD protection circuit according to the present invention is the breakdown voltage of the MOS transistor 46 at the drain junction, which is in the range of 10~15V. Because the first PNP transistor 42A is provided with the collector connected to the power node $V_{SS}$ but the second PNP transistor 42B is configured with the collector connected to the power node $V_{SS}$ through the resistor 45, a majority of the current flows through the first PNP transistor 42A, while a minority of the current flows through the second PNP transistor 42B to the P-type semiconductor layer 30. At this time, the NPN transistor 43 is non-conductive.

When the current flowing through the second PNP transistor 42B is sufficient to forward bias the junction between the P-type semiconductor layer 30 and the N-type doped region 34, the LSCR constituted by the second PNP transistor 42B and the NPN transistor 43 is triggered to turn on. Accordingly, the potential at the pad 1 can be clamped to a further low holding voltage $V_h$, and the conductive LSCR provides low resistance to bypass the ESD stress occurring at the pad 1.

Figure 6:
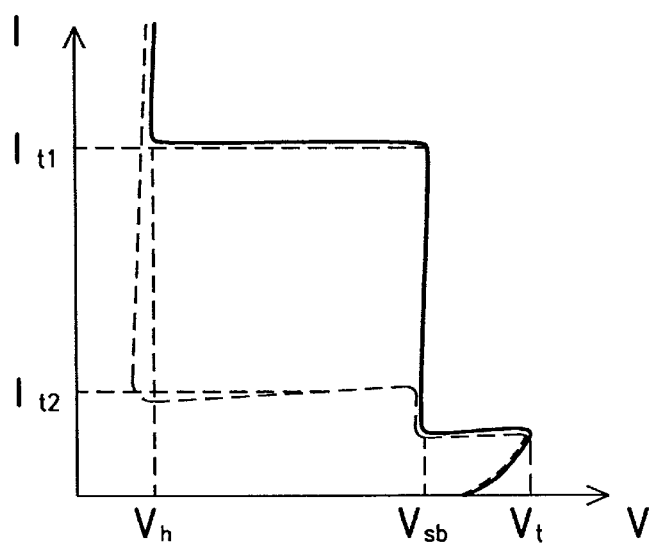
FIG. 6 depicts the I–V curve of the electrostatic discharge protection circuit as shown in FIG. 3, while the I–V curve of the conventional LVTSCR is illustrated for comparison.

The I–V curve of the ESD protection circuit of FIG. 3 is depicted in FIG. 6, with the conventional LVTSCR I–V curve is illustrated for comparison. In FIG. 6, the solid line denotes the I–V curve of the ESD protection circuit in accordance with the present invention, and dotted line designates the conventional one.

As shown in FIG. 6, the ESD protection circuit of the present invention makes use of the first PNP transistor 42A as a current-sinking device. When avalanche breakdown occurs to the drain junction of the MOS transistor 46, the PNP transistor 42A sinks a majority of the current to increase the trigger current $I_{t1}$, thereby turning on the LSCR constituted by the second PNP transistor 42B and the NPN transistor 43. In comparison, the conventional LVTSCR forward biases the junction between substrate 10 and the N-type doped region 14 as soon as the drain junction of the MOS transistor 24 enters breakdown, as shown in FIG. 1. Therefore, the trigger current $I_{t2}$ of the conventional LVTSCR is much smaller than $I_{t1}$.

Accordingly, when external overshooting or undershooting noises occurs under normal operation, the potential at the pad 1 is clamped to the snapback voltage of the PNP transistor because of the high trigger current provided by the ESD protection circuit in accordance with the present invention, thus not entering PNPN conduction. Therefore, the internal circuit 2 is immune to function disorder or device damage.

Figure 5:
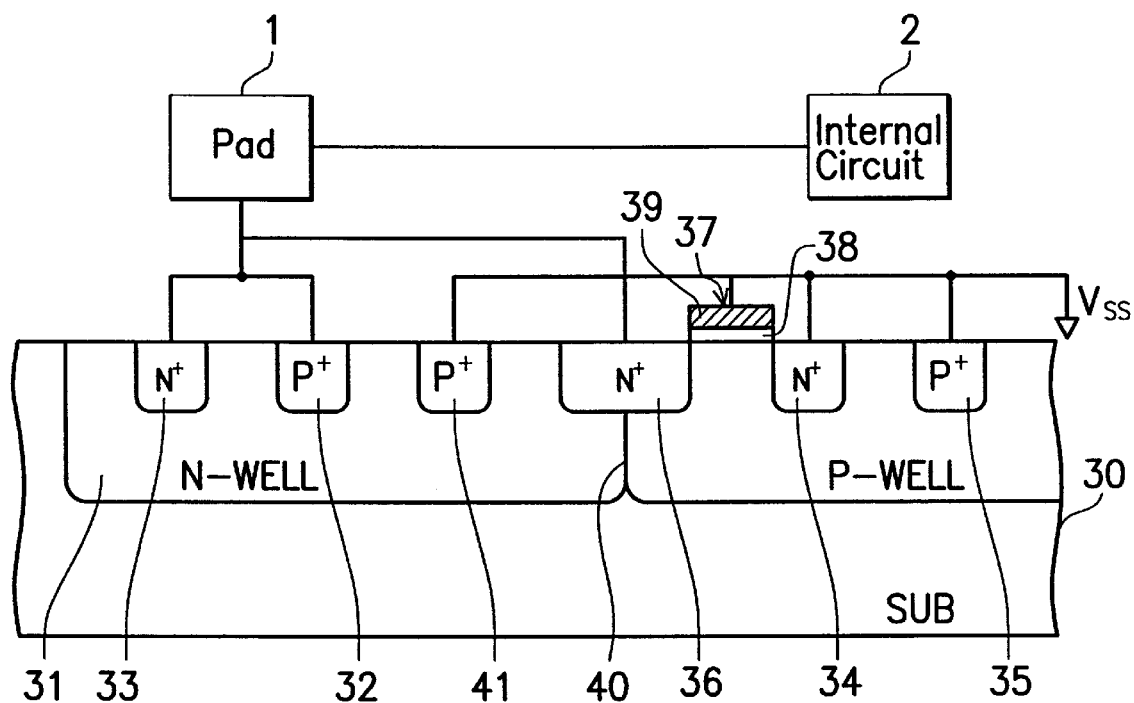
FIG. 5 schematically depicts another preferred embodiment of the present invention in a cross-sectional view.

Referring to FIG. 5, the cross-sectional view of another preferred embodiment of the present invention fabricated onto a semiconductor substrate is schematically illustrated. As compared with the above embodiment, the N-type doped region 36 is connected to the pad 1 in this embodiment.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An ESD protection circuit for protecting a circuit, comprising:
    a lateral semiconductor-controlled rectifier coupled to said circuit, said lateral semiconductor-controlled rectifier having a first common region and a second common region;
    a MOS transistor integrated with said lateral semiconductor-controlled rectifier, said MOS transistor including said first common region; and
    a current-sinking device integrated with said lateral semiconductor controlled rectifier, said current-sinking device including said second common region; wherein said current-sinking device shunts a majority of a discharge current when said MOS transistor enters breakdown, thereby increasing the trigger current of said lateral semiconductor-controlled rectifier.

2. The EDS protection circuit as claimed in claim 1, wherein said current-sinking device is a first PNP transistor.

3. The ESD protection circuit as claimed in claim 2, wherein said lateral semiconductor-controlled rectifier comprises a second PNP transistor and an NPN transistor.

4. The ESD protection circuit as claimed in claim 3, wherein said first common region serves as an emitter of said NPN transistor and a source of said MOS transistor.

5. The ESD protection circuit as claimed in claim 3, wherein said second common region serves as the emitter and base of said first PNP transistor and said second PNP transistor.

6. The ESD protection circuit as claimed in claim 1, formed in a P-type semiconductor layer and an N-type semiconductor layer to establish a junction therebetween, further comprising:
    a first P-type doped region formed in said N-type semiconductor layer;
    a first N-type doped region formed in said P-type semiconductor layer;
    a second N-type doped region formed in said P-type and N-type semiconductor layers to span said junction;
    a gate structure formed on said P-type semiconductor layer between said N-type doped regions; and
    a second P-type doped region formed in said N-type semiconductor layer between said first P-type doped region and said second N-type doped region.

7. The ESD protection circuit as claimed in claim 6, wherein said first P-type doped region, N-type semiconductor layer, and second P-type doped region constitute said current-sinking device.

8. The ESD protection circuit as claimed in claim 6, wherein said first P-type doped region, N-type semiconductor layer, and P-type semiconductor layer constitute a PNP transistor.

9. The ESD protection circuit as claimed in claim 8, wherein said N-type semiconductor layer, P-type semiconductor layer, and first N-type doped region constitute an NPN transistor.

10. The ESD protection circuit as claimed in claim 9, wherein said PNP transistor and said NPN transistor constitute said lateral semiconductor-controlled rectifier.

11. The ESD protection circuit as claimed in claim 6, wherein said N-type doped regions and said gate structure constitute said MOS transistor.

12. An ESD protection circuit, comprising:
    a P-type semiconductor layer;
    an N-type semiconductor layer formed in contact with said P-type semiconductor layer to establish a junction therebetween;
    a first P-type doped region formed in said N-type semiconductor layer;
    a first N-type doped region formed in said P-type semiconductor layer;
    a second N-type doped region formed in said P-type and N-type semiconductor layers to span said junction;
    a gate structure formed on said P-type semiconductor layer between said N-type doped regions; and
    a second P-type doped region formed in said N-type semiconductor layer between said first P-type doped region and said second N-type doped region.

13. The ESD protection circuit as claimed in claim 12, wherein said first P-type doped region, N-type semiconductor layer, and second P-type doped region constitute a current-sinking device.

14. The ESD protection circuit as claimed in claim 12, wherein said first P-type doped region, N-type semiconductor layer, and P-type semiconductor layer constitute a PNP transistor.

15. The ESD protection circuit as claimed in claim 14, wherein said N-type semiconductor layer, P-type semiconductor layer, and first N-type doped region constitute an NPN transistor.

16. The ESD protection circuit as claimed in claim 15, wherein said PNP transistor and said NPN transistor constitute a lateral semiconductor-controlled rectifier.

17. The ESD protection circuit as claimed in claim 12, wherein said N-type doped regions and said gate structure constitute a MOS transistor.

18. The ESD protection circuit as claimed in claim 16, wherein said second P-type doped region creates a current shunt path that increases the trigger current of the lateral semiconductor-controlled rectifier.

\* \* \* \* \*